United States Patent
Jung et al.

(10) Patent No.: US 7,170,431 B2
(45) Date of Patent: Jan. 30, 2007

(54) DATA TRANSMITTING CIRCUIT AND METHOD BASED ON DIFFERENTIAL VALUE DATA ENCODING

(75) Inventors: Eun-Gu Jung, Dae-gu (KR);
Jeong-Gun Lee, Chuncheon-si (KR);
Dong-Soo Har, Gwangju (KR)

(73) Assignee: Gwangju Institute of Science and Technology, Department of Information and Communications (GIST), Gwangju (KR)

( * ) Notice: Subject to any disclaimer, the term of this patent is extended or adjusted under 35 U.S.C. 154(b) by 0 days.

(21) Appl. No.: 10/967,647

(22) Filed: Oct. 14, 2004

(65) Prior Publication Data
US 2006/0007026 A1    Jan. 12, 2006

(30) Foreign Application Priority Data
Jul. 8, 2004    (KR) .................... 10-2004-0052849

(51) Int. Cl.
*H03M 7/00*    (2006.01)

(52) U.S. Cl. .......................................... 341/50; 341/51

(58) Field of Classification Search ................ 341/50, 341/51, 143; 375/281; 329/300
See application file for complete search history.

(56) References Cited

U.S. PATENT DOCUMENTS 3,614,639 A * 10/1971 Belman ...................... 329/300
3,924,186 A * 12/1975 Gordy et al. ................ 375/281

* cited by examiner

*Primary Examiner*—Jean Bruner Jeanglaude
(74) *Attorney, Agent, or Firm*—Sheridan Ross P.C.

(57) ABSTRACT

Disclosed is a data transmitting circuit and a method based on a differential value data encoding to reduce a data transmitting time by transmitting an encoded differential value. The circuit comprises an encoder for encoding and outputting a differential value between a currently transmitted data value and a previously transmitted data value, wherein the encoder inverts a phase of one output signal among $2^n$ (namely, N)-output signals in response to n-bit input value and outputs an encoded data value; and a decoder for decoding the output value of the encoder and restoring the original data value, wherein the decoder restores the original data value by adding an output value from the encoder and the previous original data value.

11 Claims, 7 Drawing Sheets

Prior Art

DATA TRANSMITTING CIRCUIT AND METHOD BASED ON DIFFERENTIAL VALUE DATA ENCODING

FIELD OF THE INVENTION

The present invention relates to a data transmitting circuit and a method for two-phase 1/N handshake to transmit data by a high speed in a system on chip(SoC), and more particularly to a data transmitting circuit and a method based on a differential value data encoding which reduces a cross-talk between transmission wires by way of a differential value data encoding resulting in the shortening of transmission time.

DESCRIPTION OF THE RELATED ART

As described in FIG. 1, the conventional data transmitting circuit comprised of an encoder 10 and a decoder 20 encodes data in the encoder 10 and transmits the encoded data to the decoder 20.

During this, the encoder 10 inverts a phase of one output signal among $2^n$(namely, N)-output signals in response to n-bit input value, and then transmits the signals to the decoder 20. That is, as described in an output waveform in FIG. 2, when a bit length of an input data to the encoder 10 is 2, N of output signal is 4 (namely, $2^2$). If the input value is 2(namely, $10_2$), a signal of the output 2 is changed to a high state to be transmitted. In addition, when the next data is 1 (namely, $01_2$), a signal of the output 1 is changed to a high state to be transmitted. When the data is 1(namely, $01_2$) again, the signal of the output 1 is changed from a high state to a low state to be transmitted.

On the other hand, the decoder 20, which has received the encoded data from the encoder 10, restores the original value previous to encoding. That is, if a bit length of data is 2 and N of output signal is 4, in case that the encoded input data is 2, the decoder 20 restores the original data value 2(namely, $10_2$). If the next transmitted data is 1, the decoder 20 restores the original data value 1(namely, $01_2$). Furthermore, the next transmitted data is 1 once again, the decoder 20 restores the original data value 1(namely, $01_2$). And then, the decoder reports the result of restoration of the original data value by ACK signal to the encoder 10.

However, in the aforementioned conventional encoding system, when data is transferred from the encoder 10 to the decoder 20, delay time to transmit data increases by a cross-talk between wires which means the effect on another wire occurred by electrical coupling of signals on different transmitting paths each other.

SUMMARY OF THE INVENTION

The present invention is proposed to provide a data transmitting circuit and a method based on a differential data encoding to decrease delay time in transmitting data by reducing a cross-talk between wires.

One aspect of the present invention is to provide, a data transmitting circuit based on a differential value data encoding, comprising: an encoder for inverting a phase of one signal among $2^n$(namely, N)-output signals in response to n-bit input value and outputting an encoded data value, wherein the encoder encodes and outputs a differential value between a currently transmitted data value and a previously transmitted data value; and a decoder for decoding the output value of the encoder and restoring the original data value, wherein the decoder restores the current original data value by adding an output value from the encoder and the previous data value.

Another aspect of the present invention is to provide, a method for transmitting data based on a differential value data encoding, the method comprising: a first step that the encoder encodes and outputs the differential value between the currently transmitted data value and the previously transmitted data value, wherein the encoder inverts a phase of one output signal among $2^n$(namely, N)-output signals in response to n-bit input value and outputs the encoded data value; and a second step that the decoder restores the current original data value by adding the output value from the encoder and the previous data value, wherein the decoder decodes the output value from the encoder and restores the original data value.

DETAILED DESCRIPTION OF PREFERRED EMBODIMENTS

Hereinafter, it will be described about a data transmitting circuit and a method therefor based on a differential value data encoding with reference to the preferred embodiments in detail as follows.

Figure 1:
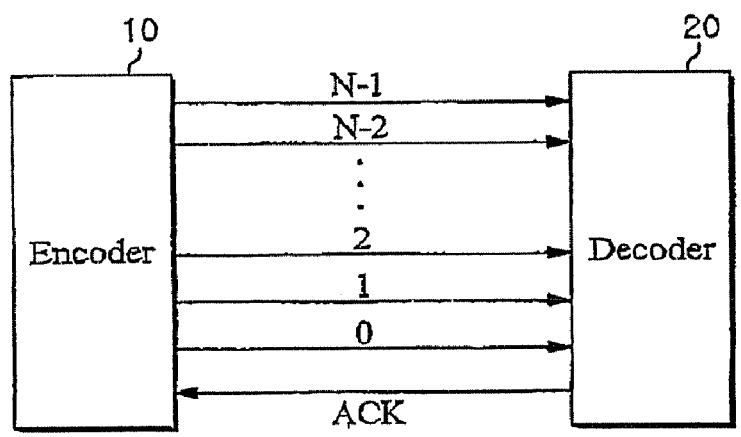
FIG. 1 is a schematic diagram illustrating a data transmitting circuit of the conventional art.
Figure 2:
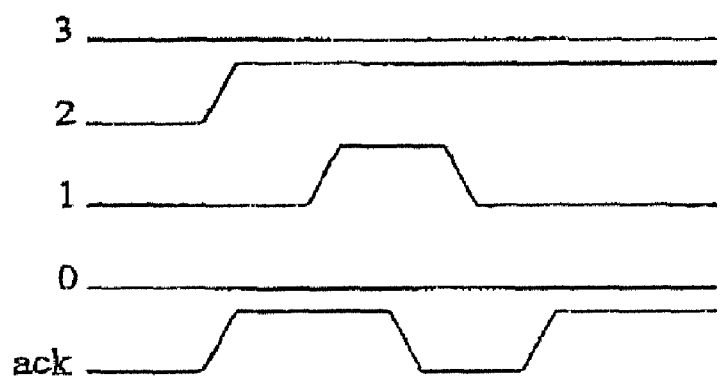
FIG. 2 is a waveform diagram illustrating a signal output in the data transmitting circuit shown in FIG. 1.
Figure 3:
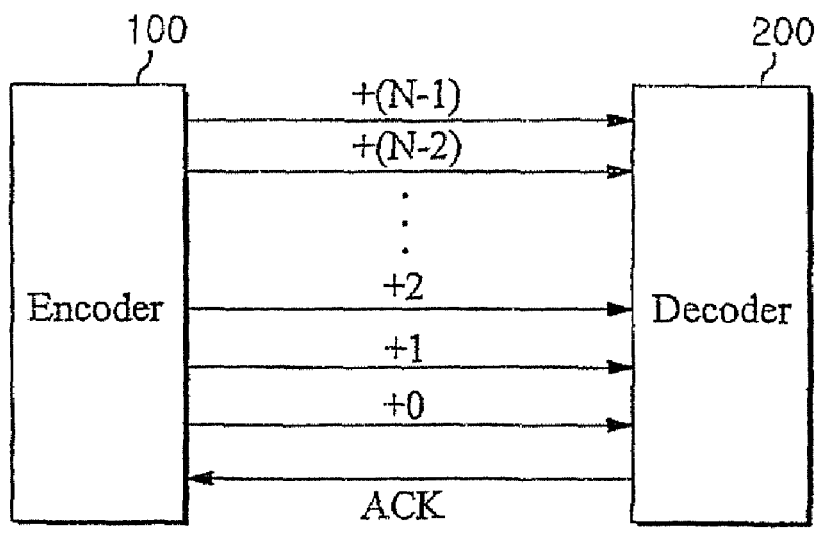
FIG. 3 is a schematic diagram illustrating a data transmitting circuit in accordance with an embodiment of the present invention.
Figure 4:
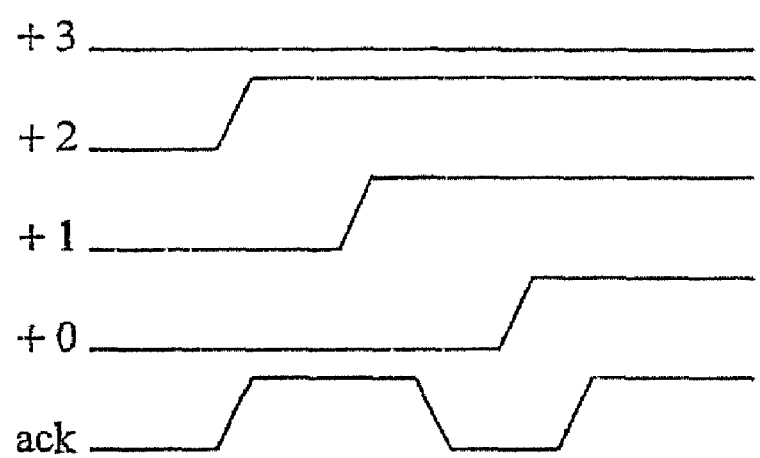
FIG. 4 is a waveform diagram illustrating a signal output in the data transmitting circuit in accordance with the present invention.

First, FIG. 3 is a schematic diagram illustrating a data transmitting circuit in accordance with an embodiment of the present invention, and FIG. 4 is a waveform diagram illustrating a signal output in a data transmitting circuit in accordance with the present invention.

As described in FIG. 3, the data transmitting circuit in accordance with the present invention comprised of an encoder 100 and a decoder 200 is a 2-phase 1/N handshake data transmitting circuit based on a data encoding using a differential value between a current data value and a previous data value.

The encoder 100 encodes and transmits data to the decoder 200, calculates a differential value between the n-bit current data value and the previous data value, and transmits the differential data value by a phase-inverted signal among $2^n$(namely, N)-output signals.

That is, as shown in FIG. 4, when a bit length of an input data to encoder 100 is 2, N of necessary output signals is 4(namely, $2^2$). When the previous input value is 0(namely, $00_2$) and the current input value is 2(namely, $10_2$), a signal of output (+)2 is changed to a high state and transmitted.

When the succeeding input value is 3(namely, $11_2$), a signal of output (+)1, as a differential value between the previous data value 2 and the current data value 3, is changed to a high state and transmitted. When the next data is 3(namely, $11_2$) once again, a signal of output (+)0, as a differential value between the previous data value 3 and the current data value 3, is changed to a high state and transmitted.

On the other side, the decoder 200 which has received the encoded data from the encoder 100 must restore the original value. That is, if the bit length of data is 2, N of output signals is 4, the encoded data is (+)2 and the previously restored data value is 0, the decoder 200 restores the original data value 2(namely, $10_2$) by adding the previously restored data value and the currently inputted differential data value. When the next data value is (+)1, the decoder 200 restores the original data value 3(namely, $11_2$) by adding the previously restored data value 2 and the currently inputted data value 1. Also, when the next-inputted data is (+)0 once again, the decoder 200 restores the previous original data value 3(namely, $11_2$).

When the decoder 200 has restored each data, the encoder 100 receives information about the result of restoration of all the original data values by ACK signal from the decoder 200.

Figure 5:
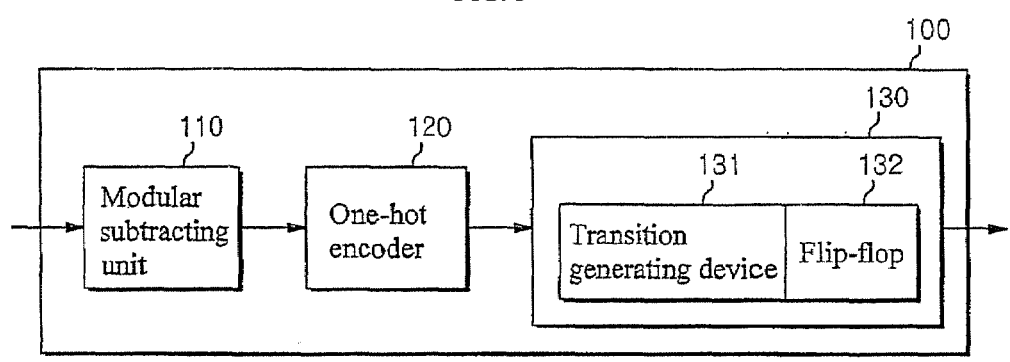
FIG. 5 is a schematic block diagram illustrating an encoder in accordance with an embodiment of the present invention.

FIG. 5 is a schematic block diagram illustrating an encoder in accordance with an embodiment of the present invention.

As described in FIG. 5, the encoder 100 in a data transmitting circuit in accordance with the present invention is comprised of a modular subtracting unit 110, an one-hot encoder 120, and a transition generator 130 which includes a transition generating device 131 and a flip-flop 132.

The modular subtracting unit 110 calculates the differential value between n-bit current data value and the previous data value.

The one-hot encoder 120 outputs the differential value, an output value from the modular subtracting unit 110, by changing the state of one signal among N(namely, $2^n$)-output signals to a high state and the state of the rest to a low state. For instance, when n is 2 and the differential value is 2, the one-hot encoder 120 considers the differential value as a binary data $10_2$, and changes the state of only output 3 to a high state among outputs 1 through 4 to be outputted.

The transition generating device 131 in the transition generator 130 changes the state of the corresponding signal in the previous output signal from the encoder 100 according to the N-output signals of one-hot encoder 120, and stores the state-changed signal in the flip-flop 132.

For example, if the one-hot encoder 120 outputs only the output 3 among the outputs 1 through 4 to a high state, the transition generator 130 confirms the output signal 3 in the previous output signal from the encoder 100 and then changes the state of output signal 3 to a high state when the previous output signal 3 is a low state, and vice versa.

The transition generator 130 may be comprised of a logical gate XOR and a flip-flop but not limited thereby.

Figure 6:
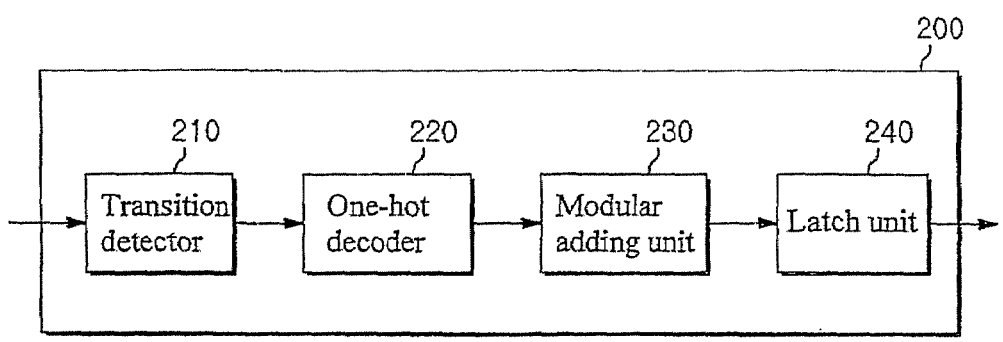
FIG. 6 is a schematic block diagram illustrating a decoder in accordance with an embodiment of the present invention.

Next, FIG. 6 is a schematic block diagram illustrating a decoder in accordance with an embodiment of the present invention. As shown in FIG. 6, the decoder 200 includes a transition detector 210, an one-hot decoder 220, a modular adding unit 230, and a latch unit 240.

When an encoded data is inputted from the encoder 100, the transition detector 210 compares the currently inputted data with the previously inputted data to detect a changed signal. And the transition detector 210 changes the state of a changed signal among N-output signals to a high state, and the rest of outputs to a low state.

The transition detector 210 may be comprised of a logical gate XOR and a flip-flop but not limited thereby.

The one-hot decoder 220 finds n-bit differential data value using an output signal from the transition detector 210, and transmits it to the modular adding unit 230.

The modular adding unit 230 storing the previous data value adds the n-bit differential value outputted from the one-hot decoder 220 to the previous data value stored therein. And, the modular adding unit 230 restores the original n-bit current data value and transfers it to the latch unit 240.

The latch unit 240 stores the current data value restored by the modular adding unit 230 and transmits ACK signal to the encoder 100.

On the other side, in FIG. 5 and FIG. 6, each encoder 100 and decoder 200 can be designed in some cases with the smaller number of blocks than those in the embodiments by combining a detailed function and also can be designed by a circuit with a simpler scheme.

Figure 7:
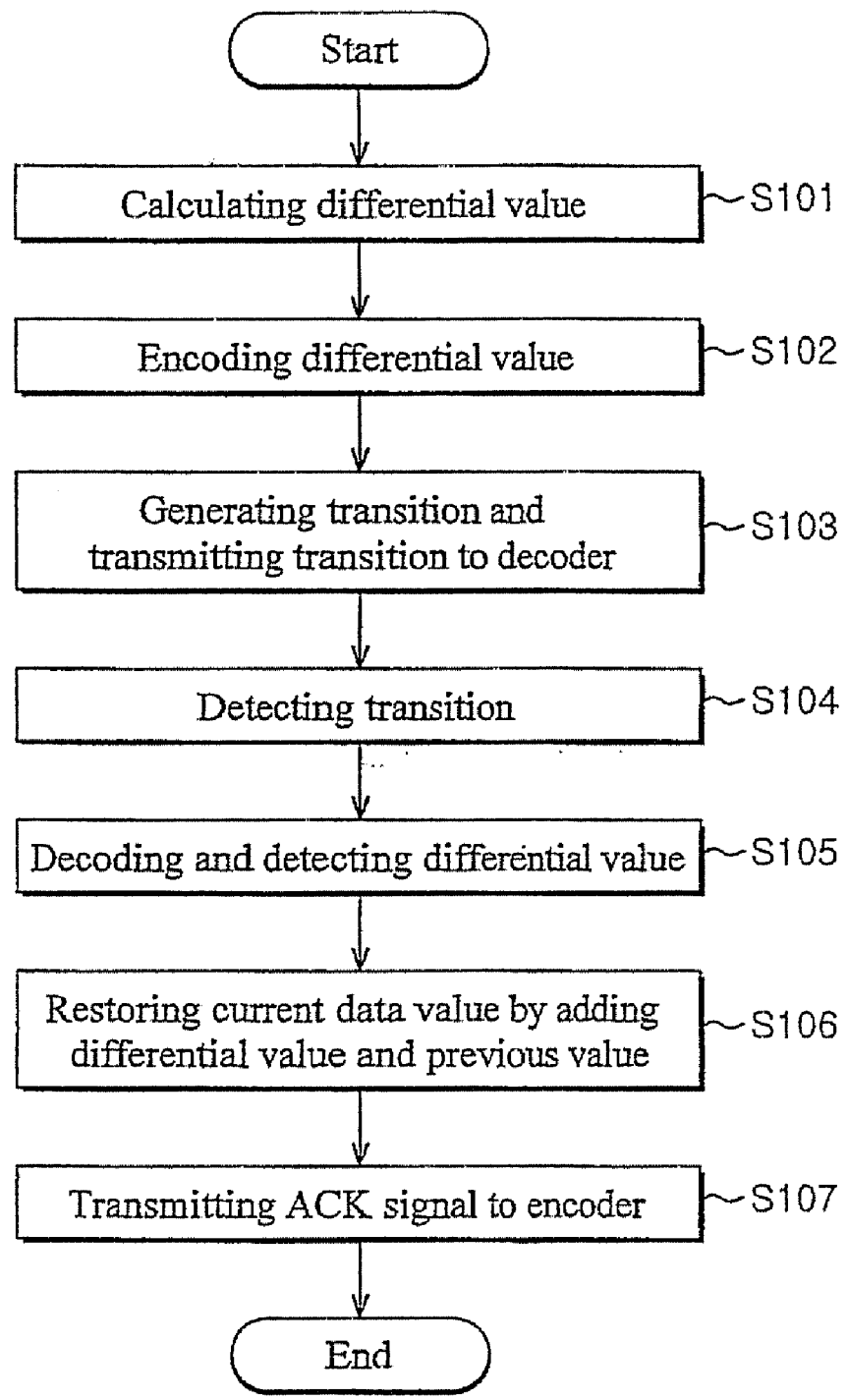
FIG. 7 is a flow chart diagram illustrating sequential procedures to transmit data in a data transmitting circuit in accordance with an embodiment of the present invention.

FIG. 7 is a flow chart diagram illustrating sequential procedures of transmitting data in a data transmitting circuit in accordance with an embodiment of the present invention.

As described in FIG. 7, data is transmitted as follows in the data transmitting circuit according to the present invention. First, when the encoder 100 receives n-bit input data, the encoder 100 calculates a differential value between the currently inputted data value and the previously inputted data value.(step S101) Then, the encoder 100 encodes the differential value by a method of generating the N-output signals after changing the state of one output signal among N-output signals to a high state and the rest of outputs to a low state according to the differential value.(step S102)

In addition, the encoder 100 changes the state of one signal corresponding to the high state signal in reference to N-output signals to the opposite state, among the N-output signals of the encoded signals in the previously transmitted signal to the decoder 200, and transmits them to the decoder 200.(step S103)

The decoder 200 which has received the output signal of the encoder 100 compares the currently inputted signal with the previously inputted signal from the encoder 100 and detects a transition by changing the state of one changed signal among N-output signals to a high state and the rest of output signals to a low state (step S104) The decoder 200 thus detects the n-bit differential value using the detected transition (step S105)

Furthermore, the decoder 200 adds the previous-original data value to the currently detected n-bit differential value, to restore the original n-bit current data value, and stores and outputs the restored current data value.(step S106) Finally, the decoder 200 transmits ACK signal to the encoder 100 (step S107)

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

Comparing the data transmitting circuit and method in accordance with the present invention with the conventional data transmitting circuit and method, the rate, having a worst delay time to transmit data in average in a data transmission in case that N is 2 and a data value is increased in sequence, is as follows. In case of the conventional data transmitting circuit, 90.1% of the overall data transmission from the encoder to the decoder has the worst transmitting time in average and the 9.9% has better transmitting time. So the conventional data transmitting circuit needs long time to transmit data due to a cross-talk between wires. Conversely, in the data transmitting circuit according to the present invention, 51.9% has the worst transmitting time and 48.1% has the better. So the cross-talk between wires is remarkably reduced in the present invention, compared with the conventional data transmitting circuit.

Therefore, by way of the data transmitting circuit and method based on the differential data encoding, it is advantageous to reduce delay time to transmit data in response to reduction of cross-talk between wires during transmitting data from the encoder to the decoder.

What is claimed is:

1. A data transmitting circuit based on a differential value data encoding, comprising:
    an encoder, having an n-bit input and a $2^n$-bit output where n is greater than one, for calculating a differential value between a currently transmitted data value and a previously transmitted data value by subtracting the previously transmitted data value from the currently transmitted data value, encoding the differential value and outputting the encoded differential value, wherein a phase of one output signal among said $2^n$(namely, N)-encoder output signals is inverted; and
    a decoder for decoding the output value of the encoder and restoring the original data value, wherein the decoder restores the original data value by adding an output value from the encoder and the previous original data value.

2. The data transmitting circuit of claim 1, wherein the encoder comprises:
    a modular subtracting unit for preforming said calculating the differential value between the currently transmitted data value and the previously transmitted data value by subtracting the previously transmitted data value from the currently transmitted data value;
    a one-hot encoder for generating the N(namely, $2^n$) numbered of output signals of which one output is in a high state and the rest are in a low state according to the output value from the modular subtraction unit; and
    a transition generator for generating a transition by inverting the phase of the previous output signal from the encoder corresponding to the changed output signal from the one-hot encoder.

3. The data transmitting circuit of claim 2, wherein the transition generator comprises a logical gate XOR and a flip-flop.

4. The data transmitting circuit of claim 1, wherein the decoder comprises:
    a transition detector for outputting transitions of which one output is in a high state and the rest of outputs are in a low state, comparing with a previously inputted data when an encoded data is received from the encoder;
    a one-hot decoder for outputting n-bit differential value by using an output signal from the transition detector;
    a modular adding unit for restoring the original n-bit data value by adding the differential value which is an output value from the one-hot decoder and the previous data value; and
    a latch unit for storing the restored n-bit original data value.

5. The data transmitting circuit of claim 4, wherein the transition generator comprises a logical gate XOR and a flip-flop.

6. A method for transmitting data based on a differential value data encoding, comprising:
    a first step, wherein the encoder, having a n-bit input and a $2^n$-bit output where n is greater than one, calculates the differential value between a currently transmitted data value and a previously transmitted data value by subtracting the previously transmitted data value from the currently transmitted data value, and encodes and outputs the differential value by providing a signal on a selected one of the $2^n$-bits of the output, wherein a phase of the selected one output signal among said $2^n$(namely, N)-encoder output signals is inverted by the encoder; and
    a second step, wherein the decoder restores the current original data value by decoding in the way of adding the output value from the encoder and the previous original data value.

7. The method of claim 6, wherein the first step further includes the steps of:
    calculating the differential value between an inputted data value and the previously transmitted data value by subtracting a previously transmitted data value from a currently transmitted data value when n-bit data is inputted;
    encoding the N(namely, $2^n$)-output signals of which one output is in a high state and the rest of outputs is in a low state according to the calculated differential value; and
    generating a transition by inverting a phase of a signal corresponding to a signal in a high state among current output signals in the previous N-output signals from the encoder, according to the current output signals in the encoding step.

8. The method of claim 7, wherein the transition generating step is performed by a logical gate XOR and a flip-flop.

9. The method of claim 6, wherein the second step further includes the steps of:
    detecting a transition in the N(namely, $2^n$)-output signals wherein one output is in a high state and the rest are in a low state, comparing with the previously inputted data with an encoded data received from the encoder;
    detecting n-bit differential value by using an output signal from the transition detecting step; and
    restoring the current n-bit original data value by adding the previous original data value and the differential value which is the output value, then storing and outputting the restored data value.

10. The method of claim 9, wherein the transition detecting step is performed by a logical gate XOR and a flip-flop.

11. A data transmitting circuit, comprising:
    an encoder, having an n-bit input and a $2^n$-bit output, comprising:
    a) a latch operable to store a previously transmitted data value;
    b) a modular subtracting unit for calculating an n-bit differential data value by subtracting said previously transmitted data value stored in said latch from a currently transmitted data value received at said n-bit input;
    c) a one-hot encoder for converting said n-bit differential data value to a $2^n$-bit differential data value, wherein said $2^n$-bit data value is represented by a logical one present on only one of a set of $2^n$ data lines, wherein both said n-bit differential data value and said $2^n$ bit differential date value have a total of $2^n$ possible values; and d) a transition generator for inverting the phase of one of said 2-bit encoder outputs in response to a logical one present on a corresponding one of said $2^n$ data lines representing said $2^n$-bit differential data value;

a set of transmission lines, wherein said set of transmission lines are interconnected to said transition generator;

a decoder, having said $2^n$-bit encoder output as an input and a n-bit output, wherein said input is interconnected to said $2^n$-bit encoder output by said set of transmission lines, said decoder comprising:
  a) a latch operable to store a previously received data value;
  b) a transition detector for detecting a phase change on any of said $2^n$-bit decoder inputs; wherein in response to said phase change said transition detector asserts a logical one on a corresponding one of $2^n$ received data lines; wherein said $2^n$ received data lines represent a $2^n$-bit received differential data value;
  c) a one-hot decoder for converting said $2^n$-bit received differential data value to an n-bit received data value; wherein both said n-bit received differential data value and said $2^n$-bit received differential date value have a total a $2^n$ possible distinct values; and
  d) a modular adding unit for restoring said n-bit encoder input data value by adding said previously received data value contained in said decoder latch to said n-bit received data value.

* * * * *